United States Patent [19]

Jason

[11] Patent Number: 4,763,081

[45] Date of Patent: Aug. 9, 1988

[54] REDUCING DISTORTION IN ACTIVE MOSFET-C LOW PASS FILTERS

[75] Inventor: Barry L. Jason, Bedford, Tex.

[73] Assignee: Motorola, Inc., Schaumburg, Ill.

[21] Appl. No.: 72,816

[22] Filed: Jul. 13, 1987

[51] Int. Cl.$^4$ ............................................. H03F 1/32
[52] U.S. Cl. ..................................... 330/149; 330/107
[58] Field of Search ............... 330/107, 109, 149, 304; 307/520; 328/162; 332/37 R, 37 D; 333/172

[56] References Cited

U.S. PATENT DOCUMENTS 4,581,587 4/1986 Powell ............................ 330/107
4,628,278 12/1986 Bottman ......................... 330/149

FOREIGN PATENT DOCUMENTS 101404 6/1982 Japan ............................... 330/149

OTHER PUBLICATIONS

Fujii, "Predistorted RC Active Filters with Low Pole Sensitivity to Finite GB of Single Pole Operational Amplifiers", *The Transactions of the Iece of Japan*, vol. E63, No. 10, Oct. 1980, pp. 715-722.

*Primary Examiner*—James B. Mullins
*Attorney, Agent, or Firm*—Steven G. Parmelee; Melvin A. Schechtman

[57] ABSTRACT

A predistortion network preceding a continuous-time active MOSFET-C lowpass filter cancels the inherent distortion of the filter over a large portion of its passband. The lowpass filter has resistive feedback and input devices whose ratio controls its transfer function at DC and low frequencies. The predistortion network has resistive feedback and input devices that control its transfer function and that match the input and feedback devices, respectively, of the active filter. Cancellation of distortion results in low distortion operation for signals in the frequency range from DC to a substantial fraction of the passband. As the filter response rolls off at higher frequencies, imperfect cancellation results in distortion performance similar to that without predistortion. The invention reduces large signal distortion of active MOSFET-C filters, which enhances their use in monolithic system with switched capacitor circuits.

4 Claims, 3 Drawing Sheets

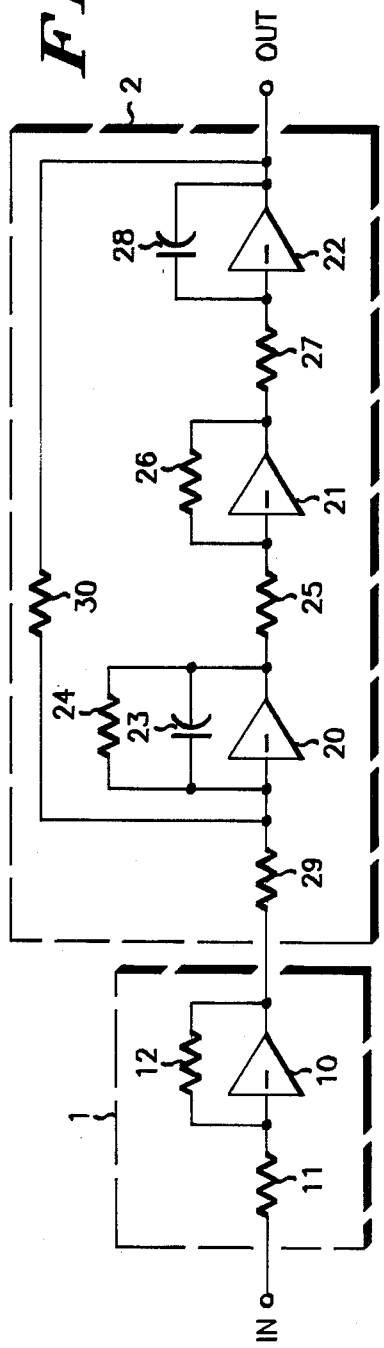
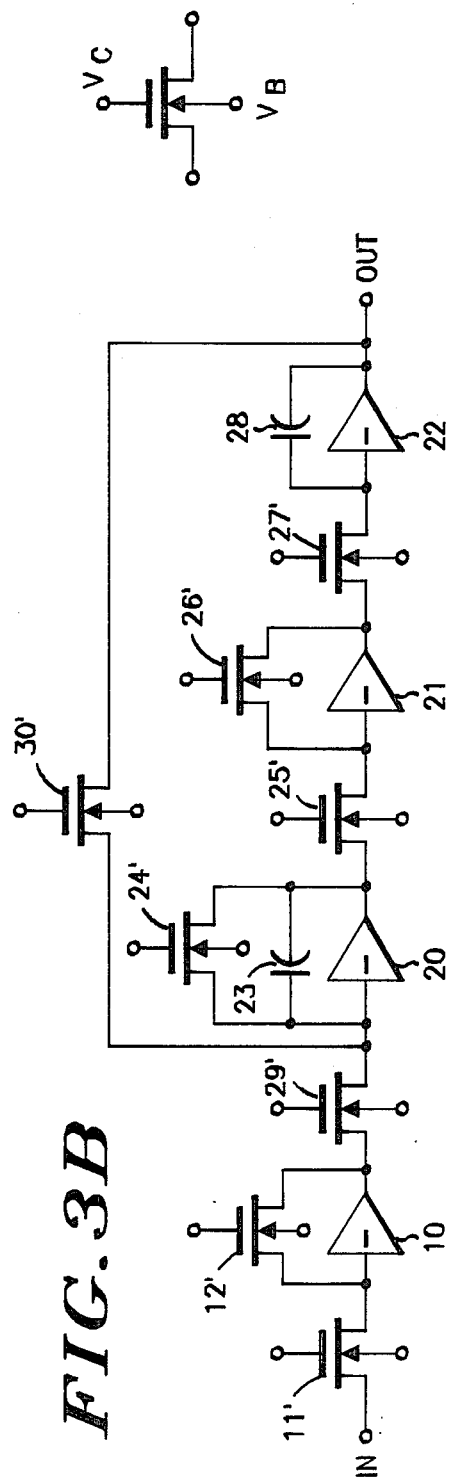

REDUCING DISTORTION IN ACTIVE MOSFET-C LOW PASS FILTERS

BACKGROUND OF THE INVENTION

1. Field of the Invention

This invention relates to reducing distortion in monolithic active lowpass filters that use MOS field effect transistors as voltage variable resistors.

2. Description of the Prior Art

Both switched capacitor and continuous-time active filters have been used in large scale, monolithic analog filter applications. Switched capacitor filters provide stable, precise transfer functions with good large signal capability but are often unacceptable because they process discrete time, sampled analog signals, rather than continuous signals. To interface with continuous-time circuits, switched capacitor filters usually require active or passive anti-aliasing and data reconstruction (smoothing) filters.

Continuous-time filters avoid sampling but have other deficiencies. Monolithic continuous-time filters are often active RC circuits that include amplifiers, resistors, and capacitors in a feedback configuration. The frequency response of an RC active filter depends on coefficients that are products of absolute resistance and capacitance values, both of which can be subject to considerable random variation with monolithic processing. However, ratios of resistances and ratios of capcitors remain substantially constant with process variations; therefore, ratios of RC products also remain stable.

A recently developed technique to overcome random coefficient variation is to use field effect transistors (MOSFETs) operated in the nonsaturation (linear) region as electrically variable resistances. An externally variable control voltage applied to the gates of the devices can be used to automatically tune filters to frequency after fabrication or to readjust tuning as coefficients vary with temperature. A more complete discussion of these filters appears in the paper by M. Banu and Y. Tsividis entitled "Fully Integrated Active RC Filters in MOS Technology," *IEEE Journal of Solid State Circuits*, Vol. SC-18, No. 6, December 1983, to which the reader is referred for background and a detailed analysis.

The drain current of a MOSFET operated in the linear region, as shown in FIG. 2, may be expressed as:

$$I_D = 2K\{(V_C - V_B - V_{FB} - \phi_B)(V_1 - V_2) - (1/2)[(V_1 - V_B)^2 - (V_2 - V_B)^2] - (2/3)\gamma[(V_1 - V_B + \phi_B)^{3/2} - (V_2 - V_B + \phi_B)^{3/2}]\} \quad (1)$$

where $$\gamma = \frac{(2qN_A\epsilon_s)^{\frac{1}{2}}}{C'_{ox}},$$

$$K = \mu \frac{C'_{ox}}{2} \frac{W}{L}, \text{ and}$$

$I_D$ is the drain current in the linear region,
$V_C$, $V_B$, are the gate, substrate, drain, and
$V_1$, $V_2$ source potentials with respect to ground,
W and L are the effective channel width and length, that is, the width and length taking into account process variations, such as outdiffusion, that affect the W and L indicated on a layout,
$\mu$ is the carrier effective mobility in the channel,
$V_{FB}$ is the flat-band voltage,
$N_A$ is the substrate doping concentration,
$C'_{ox}$ is the gate oxide capacitance per unit area,
$\epsilon_s$ is the silicon dielectric constant,
q is the electron charge, and
$\phi_B$ is the approximate surface potential in strong inversion for zero backgate bias. (Classically, this potential has been taken to be $2\phi_F$ with $\phi_F$ the Fermi potential, but $\phi_B$ is actually higher by several kT/q.)

The 3/2 power terms can be expanded as a Taylor series with respect to $V_1$ and $V_2$:

$$I_D = K[a_1(V_1 - V_2) + a_2(V_1^2 - V_2^2) + a_3(V_1^3 - V_2^3) + \ldots], \quad (2)$$

where the coefficients $a_i$ are independent of $V_1$ and $V_2$ and are functions of the gate and substrate potentials and the process and physical parameters of the device.

Expression (2) shows that the drain current is a nonlinear function of the drain to source voltage applied across the device. For small signals, the linear term, $Ka_1$, predominates, and the device may be treated as a linear conductance, g, as shown in expression (3):

$$g = \left[\mu C'_{ox} \frac{W}{L} (V_c - V_T)\right], \quad (3)$$

where the threshold voltage at $-V_B$ backgate bias is given by:

$$V_T = V_{FB} + \phi_B + \gamma(-V_B + \phi_B)^{\frac{1}{2}}.$$

The small-signal conductance of the device depends on the voltage applied to its gate, its effective width-to-length ratio, and other physical parameters related to fabrication. Good matching is achieved by providing all MOSFETs in a particular monolithic circuit with the same gate voltage; monolithic fabrication inherently provides matching of fabrication parameters. Varying the effective W/L ratio then provides a means to obtain different nominal resistances.

Once an active RC filter has been fabricated, its coefficients can be adjusted by varying the gate voltage applied to the MOSFET-resistors. One method that has been used to adjust coefficients is to measure a parameter related to an RC product, such as a phase shift or frequency of oscillation of a test circuit, to compare that quantity to an external reference, and to modify the gate voltage to adjust the measured parameter to the required value. Since all MOSFETs resistors have the same gate voltage, modifying the gate voltage varies the small signal conductances of all MOSFETs simultaneously. While the individual conductances change, their ratios remain constant and are related according to their effective W/L ratios. The RC products also vary but keep the same ratios among themselves. Tuning a single RC product to a known value then suffices to tune an entire filter to the proper frequency. Further advantage can be taken of the inherent tracking in monolithic design by tuning several filters on a single chip with a single gate control voltage.

A prior art limitation in using MOSFETs as resistors has been that the inherent non-linearity severely restricts the peak voltage that may be applied to filters without producing excessive distortion. One approach to reduce distortion in systems has been to attenuate signals before filtering and to boost them after filtering, so that their level never exceeds the signal handling ability of the filter. However, reducing signal level degrades system noise performance. Another approach in the prior art is to use differential filter circuits; these suppress even-order harmonics but increase circuit complexity, size, or power dissipation.

For complex system filtering tasks, there has also been a need in the prior art to combine high-order switched capacitor filters with lower-order continuous-time active RC filters for anti-aliasing and data reconstruction filtering. However, to handle the highlevel signals that are practical and desirable with switched capacitor filtering, there has been a need for compact, continuous-time active RC filters that neither affect noise performance nor increase circuit complexity and size as do prior art designs.

SUMMARY OF THE INVENTION

The invention is to reduce distortion in an active lowpass filter by preceding it with a matched predistortion network. The lowpass filter must have feedback and input resistances whose ratio controls its transfer function at DC and low frequencies. The predistortion network has feedback and input resistances that match the input and feedback resistances, respectively, of the active filter and that control the transfer function of the predistortion network. Cancellation of distortion results in low distortion operation for signals in the frequency range from DC to a substantial fraction of the passband. As the filter response rolls off at higher frequencies, imperfect cancellation results in distortion performance similar to that without predistortion.

BRIEF DESCRIPTION OF THE DRAWINGS

The invention is best explained by reference to the Drawings, in which:

FIG. 3a shows a circuit diagram of the prototype for an active biquadratic lowpass filter preceded by a single amplifier predistortion network, and FIG. 3b shows the filter and predistortion network with MOSFETs substituted for the resistors, as practiced according to the invention;

DESCRIPTION OF THE PREFERRED EMBODIMENT

Figure 1:
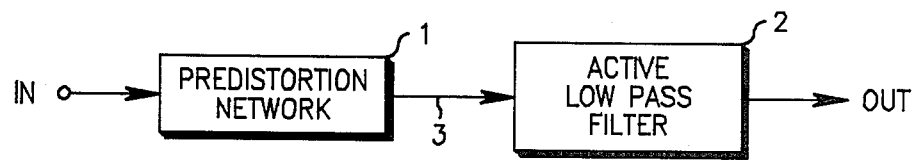
FIG. 1 is a block diagram showing an active filter preceded by a predistortion network.
Figure 2:
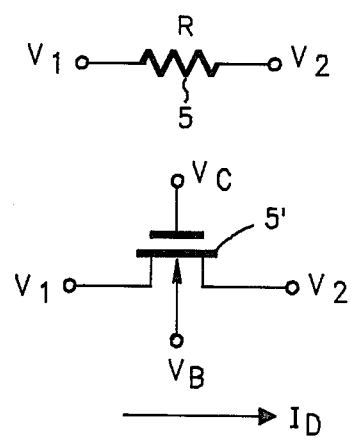
FIG. 2 shows the substitution of a MOSFET, operated in the nonsaturation region, for a resistor.
Figure 4:
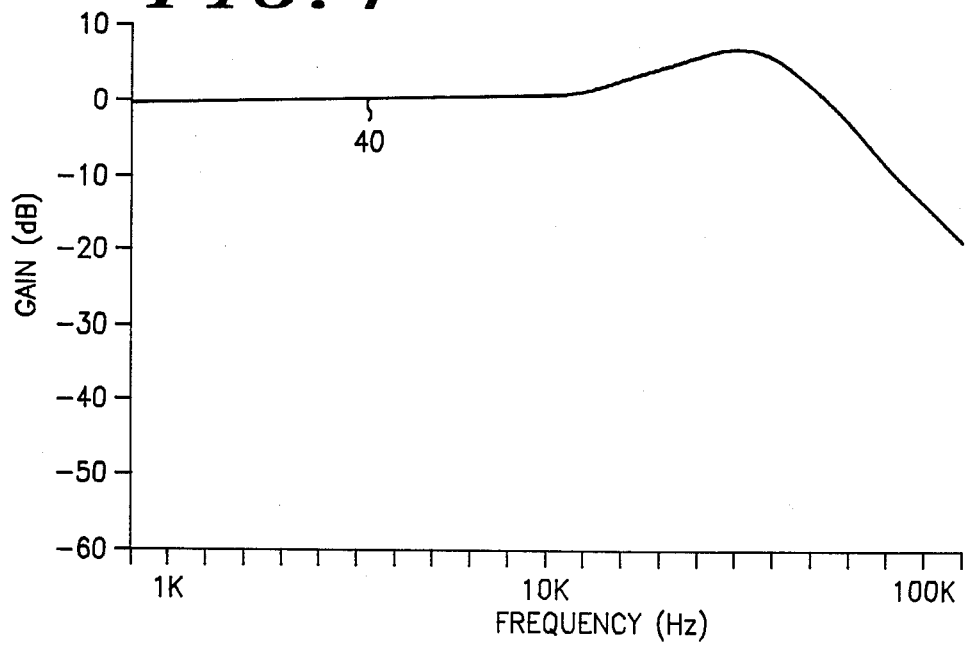
FIG. 4 shows a magnitude versus frequency response plot for the filter of FIG. 3b, using component values as described below.

With reference to FIG. 1, the invention includes generally a predistortion network 1 that couples 3 to an active lowpass filter 2.

The preferred embodiment is an active MOSFET-C lowpass filter in cascade with a single amplifier predistortion network using MOSFETs as input and feedback devices matched to the feedback and input devices, respectively, of the filter. FIG. 3A shows the linear component circuit from which the MOSFET-C embodiment is derived; it comprises biquadratic active RC filter 2 in cascade with predistortion network 1. The "biquad" comprises amplifiers 20, 21, and 22, resistors 24, 25, 26, 27, 29, and 30, and capacitors 23 and 28. The amplifiers may be high-gain operational, differential input, or non-differential input amplifiers, according to speed, size, and current drain requirements.

FIG. 3B shows the substitution of MOSFETs operated in the nonsaturation region for the passive resistors of the circuit in FIG. 3A. The MOSFET devices are designated by primed reference numerals 11', 12', 24', 25', 26', 27', 29', and 30', respectively.

Devices 30' and 29' control the DC and low frequency gain of active filter 2 by negative feedback. Feedback device 12' in the predistortion network matches input device 29' in the filter; input device 11' matches feedback device 30'. Feedback around the amplifiers holds their summing junctions at ground potential, so, at DC and frequencies sufficiently low that filter roll-off is negligible, the currents through devices 29' and 30' will be equal and opposite.

Input voltage to predistortion network 1 develops an input current through device 11'; feedback causes this current to flow through device 12' and develop an inverted voltage at the output of the predistortion network. The current through device 11' will be distorted because of the nonlinearities in MOSFET device 11'. The output voltage of the predistortion network will be further distorted, because of the nonlinearity in device 12', as well as inverted from the polarity of the input voltage.

The output voltage of the predistortion network couples to the biquad and develops an input current through device 29'. At low frequencies, integrator capacitors 23 and 28 have little effect, and the filter acts as a feedback circuit with three cascaded amplifiers and causes the current through device 29' to flow through device 30'. Current through device 30' develops the output voltage of the filter; this voltage will be inverted from the voltage coupled to the input of the filter from the output of the predistortion network.

Device 29' matches device 12', and each has one terminal coupled to a summing junction held at signal ground. Since the other terminals of device 29' and 12' are coupled together, the potentials across the two devices are identical, and equal currents will flow through both. Since the current through device 12' equals the current through device 11', and the current through device 30' equals the current through device 29', devices 30' and 11' will support equal currents. Device 30' matches device 11', so the potentials across them must be identical. One terminal of each device couples to a summing junction held at signal ground, so the voltages at the other terminal of each device will be identical. In other words, the voltage at the output of the filter will equal the input voltage applied to the predistortion network, without distortion, even though the currents may be distorted.

Cancellation of distortion is effective only for DC and low frequencies, where the filter may be treated as a simple resistive feedback circuit. At higher frequencies, the integrating capacitors 23 and 28 begin to modify the transfer function, and the current through resistive feedback device 30' will no longer equal the current through input device 29'. Although cancellation of distortion is ineffective at the higher frequencies, the filter does attenuate high frequency noise components, such as clock feedthrough from switched capacitor filters. High frequency noise components are usually small in switched capacitor systems, so total output noise and distortion from the lowpass filter will be small.

Figure 5:
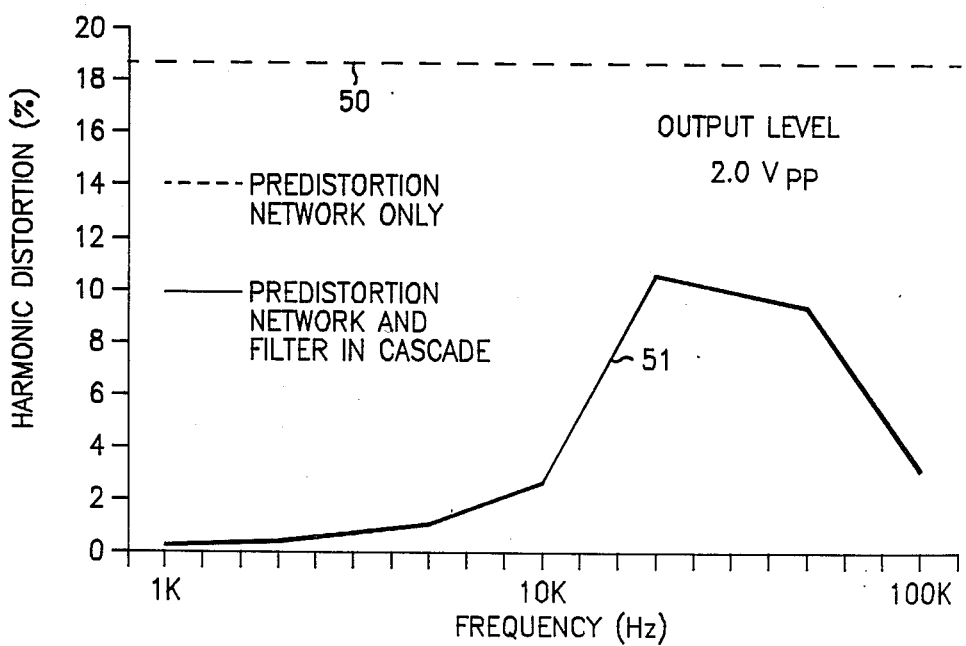
FIG. 5 shows the improvement in total harmonic distortion (THD) obtained by practicing the invention in the particular application shown in FIG. 3b.

To illustrate the performance improvement provided by a predistortion network constructed in accordance with this invention, computer simulations were made for a two-pole, 63 KHz lowpass filter using P-channel MOSFETs and with component values shown below in the table of prototype values. With predistortion, the filter provides 2 Vpp output signal with less than 1% total harmonic distortion (THD) for frequencies up to 10 KHz; whereas, without predistortion, at that distortion level, the filter handles only 0.2 Vpp maximum output. Plot 50 of FIG. 5 shows the amount of predistortion provided by the network to cancel the inherent distortion of the lowpass filter. Plot 51 shows the distortion performance of the combination of filter and predistortion network at 2 Vpp output level.

| RC Prototype Values | |
|---|---|
| $C_{23}$, $C_{28}$ | 27.9 pF |
| $R_{24}$ | 138 kOhms |
| All other R's | 282 kOhms |

| MOSFET Data (P-channel) | |
|---|---|
| $V_B$ | 1.09 V (bulk to source) |
| $V_C$ | −3.91 V (gate to source) |
| $V_T$ | −1.14 V |
| $\gamma$ | 0.662 |
| $\phi_B$ | 0.636 (taken as $2\phi_f$) |
| 2K | $1.26 \times 10^{-7}$ |
| W | 4.35 microns |
| L | 330 microns |

Although the invention has been disclosed in connection with the particular embodiment described above, it is understood that the novelty lies in the cascade configuration of active lowpass filter and matched predistortion network preceding it. The scope of the invention as claimed includes modifications and additional applications that will be apparent to those skilled in the art.

I claim:

1. A reduced distortion active filter comprising an active lowpass filter preceded by a predistortion network, in which:
   the low frequency gain of the active lowpass filter is the ratio of the resistances of a feedback device in the active lowpass filter and an input device in the active lowpass filter;
   the gain of the predistortion network is the ratio of the resistance of a feedback device in the predistortion network and an input device in the predistortion network;
   the feedback device in the predistortion network matches the input device in the active lowpass filter; and
   the input device in the predistortion network matches the feedback device in the active lowpass filter,
   whereby the predistortion network distorts signals coupled to it and compensates for the distortion introduced by the active lowpass filter.

2. The reduced distortion active filter of claim 1 in which the active lowpass filter is a monolithic active RC circuit comprising amplifiers, capacitors, and resistive devices, with field-effect transistors operated in the nonsaturation region functioning as the resistive devices.

3. The reduced distortion active filter of claim 2 in which the amplifiers have non-differential inputs.

4. In an active lowpass filter, the method of reducing distortion for signals having frequency components in the range from DC through a substantial portion of the passband of the lowpass filter, comprising the steps of predistorting input signals to the active lowpass filter to produce predistorted intermediate signals by passing the input signals through a feedback predistortion circuit preceding the active lowpass filter, the transfer function of the feedback predistortion circuit being determined by the ratio of resistive feedback and input devices that match, respectively, resistive input and feedback devices that determine the DC and low-frequency transfer function of the active lowpass filter, and filtering the predistorted intermediate signals to produce output signals, thereby reducing distortion in the output signals from the active lowpass filter.

* * * * *